United States Patent
Salter et al.

(10) Patent No.: US 11,760,281 B2
(45) Date of Patent: Sep. 19, 2023

(54) BATTERY-POWERED VEHICLE SENSORS

(71) Applicant: Ford Global Technologies, LLC, Dearborn, MI (US)

(72) Inventors: Stuart C. Salter, White Lake, MI (US); Justin Carroll, New Baltimore, MI (US); Donald Paul Bilger, Livonia, MI (US); Zeljko Deljevic, Plymouth, MI (US); Hussein H. Berry, Dearborn, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 410 days.

(21) Appl. No.: 17/099,869

(22) Filed: Nov. 17, 2020

(65) Prior Publication Data

US 2022/0153212 A1    May 19, 2022

(51) Int. Cl.
*B60R 16/023* (2006.01)
*B60R 11/04* (2006.01)
*G01S 13/931* (2020.01)
*G01R 31/382* (2019.01)

(52) U.S. Cl.
CPC ............ *B60R 16/023* (2013.01); *B60R 11/04* (2013.01); *G01R 31/382* (2019.01); *G01S 13/931* (2013.01)

(58) Field of Classification Search
CPC . B60R 16/023; B60R 11/04; B60R 2011/004; B60R 16/03; G01R 31/382; G01S 13/931; G01S 7/4008; G01S 2013/9327; G01S 13/867; B60Q 1/44; B60Q 1/0023
USPC .......................................................... 701/36
See application file for complete search history.

(56) References Cited

U.S. PATENT DOCUMENTS

| | | |
|---|---|---|
| 9,041,948 B2 | 5/2015 | Nagata |
| 9,438,868 B2 | 9/2016 | Boettiger |
| 10,607,458 B1 * | 3/2020 | Sampson ................. G08B 3/10 |
| 10,712,742 B2 | 7/2020 | Valois |
| 10,899,317 B1 * | 1/2021 | Moeller ............... G08B 25/008 |
| 11,099,264 B2 | 8/2021 | Bhatia et al. |
| 11,104,270 B1 | 8/2021 | Timms |
| 11,427,143 B1 | 8/2022 | Linsmeier et al. |

(Continued)

FOREIGN PATENT DOCUMENTS

| | | |
|---|---|---|
| CN | 109996037 A | 7/2019 |
| DE | 102015118874 A1 | 5/2017 |

(Continued)

OTHER PUBLICATIONS

Final Office Action for U.S. Appl. No. 17/199,805 as issued by the USPTO dated Dec. 6, 2022.

(Continued)

*Primary Examiner* — Vivek D Koppikar
*Assistant Examiner* — Dominick Mulder
(74) *Attorney, Agent, or Firm* — Frank Lollo; Bejin Bieneman PLC (57) ABSTRACT

A computer includes a processor and a memory storing instructions executable by the processor to instruct a first sensor to run at a scanning rate; in response to a trigger event, reduce the scanning rate; in response to receiving data from the first sensor indicating a newly present object, turn on a second sensor; and then record data from the second sensor. The second sensor has a higher power draw than the first sensor.

19 Claims, 6 Drawing Sheets

(56) References Cited

U.S. PATENT DOCUMENTS

| | | |
|---|---|---|
| 2004/0257045 A1 | 12/2004 | Sada et al. |
| 2005/0073433 A1 | 4/2005 | Gunderson et al. |
| 2005/0200606 A1* | 9/2005 | Willemin ............ G06F 1/3203 345/166 |
| 2007/0067079 A1* | 3/2007 | Kosugi ................ G07C 5/085 348/148 |
| 2007/0241897 A1 | 10/2007 | Knuepfer |
| 2008/0097664 A1 | 4/2008 | Aoyama et al. |
| 2010/0194884 A1 | 8/2010 | Plaster |
| 2010/0265344 A1* | 10/2010 | Velarde ................ H04N 5/783 348/222.1 |
| 2011/0216200 A1 | 9/2011 | Chung et al. |
| 2012/0044046 A1 | 2/2012 | Al-Jafar |
| 2012/0044327 A1* | 2/2012 | Horita ................. H04N 13/296 348/47 |
| 2012/0188054 A1 | 7/2012 | Bongard |
| 2016/0104325 A1 | 4/2016 | Lu |
| 2016/0323508 A1 | 11/2016 | Ayalasomajula et al. |
| 2016/0331192 A1* | 11/2016 | Rubenson ............ A47K 10/36 |
| 2016/0332535 A1* | 11/2016 | Bradley ................ G08B 21/24 |
| 2016/0356594 A1 | 12/2016 | Sorenson |
| 2017/0160392 A1 | 6/2017 | Brisimitzakis et al. |
| 2017/0337435 A1 | 11/2017 | Uliyar et al. |
| 2018/0053313 A1 | 2/2018 | Smith |
| 2018/0324393 A1* | 11/2018 | Ryan .................... G06V 20/52 |
| 2018/0332218 A1* | 11/2018 | Yoshimura ............ H04N 23/90 |
| 2019/0141419 A1* | 5/2019 | Xu ........................ H04W 52/02 |
| 2019/0225150 A1* | 7/2019 | Nohl ....................... G01S 13/93 |
| 2019/0228647 A1 | 7/2019 | Conde et al. |
| 2019/0391250 A1 | 12/2019 | Cohen et al. |
| 2020/0025964 A1 | 1/2020 | Kubo |
| 2020/0031312 A1 | 1/2020 | Schat et al. |
| 2020/0033849 A1 | 1/2020 | Yiu et al. |
| 2020/0114886 A1 | 4/2020 | Kim |
| 2020/0209377 A1 | 7/2020 | Ogura et al. |
| 2020/0209869 A1 | 7/2020 | Toyoura et al. |
| 2020/0247423 A1* | 8/2020 | Almahmoud .......... G01G 19/12 |
| 2020/0282921 A1 | 9/2020 | Herman |
| 2020/0327757 A1* | 10/2020 | Kelley ............... G07C 9/00309 |
| 2020/0339101 A1 | 10/2020 | Gantt, Jr. et al. |
| 2020/0408876 A1 | 12/2020 | Weber et al. |
| 2021/0026019 A1 | 1/2021 | Gahagan et al. |
| 2021/0092321 A1* | 3/2021 | Li .......................... G11B 27/34 |
| 2021/0223359 A1 | 7/2021 | Harrison |
| 2021/0245662 A1* | 8/2021 | Blank .................. H10K 71/135 |
| 2021/0309183 A1 | 10/2021 | Bielby et al. |
| 2021/0309257 A1* | 10/2021 | Roberts ............ B60W 60/0016 |
| 2021/0349204 A1 | 11/2021 | Brodsky et al. |
| 2022/0123570 A1 | 4/2022 | Fuchs et al. |

FOREIGN PATENT DOCUMENTS

| | | |
|---|---|---|
| WO | 2019013948 A1 | 1/2019 |
| WO | 2021003440 A1 | 1/2021 |

OTHER PUBLICATIONS

Non-Final Office Action for U.S. Appl. No. 17/199,805 as issued by the USPTO dated Aug. 23, 2022.

Non-Final Office Action for U.S. Appl. No. 17/199,954, filed Mar. 12, 2023, as issued by the USPTO dated Jun. 22, 2023.

Ex-Parte Quayle Office Action for U.S. Appl. No. 17/199,768, filed Mar. 12, 2023, as issued by the PTO dated Jun. 23, 2023.

Non-Final Office Action for U.S. Appl. No. 17/199,688, filed Mar. 12, 2021, as issued by the USPTO dated Jul. 19, 2023.

* cited by examiner

BATTERY-POWERED VEHICLE SENSORS

BACKGROUND

Center high-mounted stop lamps (CHMSL) are brake lamps positioned above a rear window of a vehicle and centered laterally on the vehicle. CHMSLs have been required by United States regulations for new cars and light trucks since the 1990s. The purpose of the CHMSL is to provide better visibility to other vehicles, which may not have a good view of the left and right brake lamps of the vehicle.

DETAILED DESCRIPTION

A computer includes a comprising a processor and a memory storing instructions executable by the processor to instruct a first sensor to run at a scanning rate; in response to a trigger event, reduce the scanning rate; in response to receiving data from the first sensor indicating a newly present object, turn on a second sensor, wherein the second sensor has a higher power draw than the first sensor; and then record data from the second sensor.

The trigger event may be failing to detect the newly present object for at least a threshold duration.

The instructions may further include to transmit a message including the recorded data from the second sensor to a remote computing device. The message may be a first message, the instructions may further include to receive a second message from the remote computing device in response to the first message, and to record the second message in a log upon determining that the second message includes a confirmation of a presence of the newly present object. The trigger event may be a lack of any second messages at a current location of a vehicle including the sensors in the log.

The instructions may further include to, in response to the log including at least one second message at a current location of a vehicle including the sensors, increase the scanning rate.

The trigger event may be a state of charge of a battery decreasing below a charge threshold.

The trigger event may be a time of day being during daytime.

The trigger event may be a first trigger event, and the instructions may further include to, in response to a second trigger event, increase the scanning rate. The second trigger event may be data indicating precipitation.

The instructions may include to transmit a message to a remote computing device in response to the second trigger event.

The instructions may include to prevent the first sensor from running in response to receiving data from the first sensor indicating a lack of previously present objects in a region. The instructions may include to transmit a message to a remote computing device in response to receiving the data from the first sensor indicating a lack of previously present objects in the region.

The instructions may include to, in response to receiving the data from the first sensor indicating the newly present object, transmit a message instructing at least one vehicle system to wake up.

A system for a vehicle includes a first sensor, a second sensor having a higher power draw than the first sensor, and a computer communicatively coupled to the first sensor and the second sensor. The computer is programmed to instruct the first sensor to run at a scanning rate; in response to a trigger event, reduce the scanning rate; in response to receiving data from the first sensor indicating a newly present object, turn on the second sensor; and then record data from the second sensor.

The system may further include a housing containing the first sensor, the second sensor, and the computer. The system may further include a battery in the housing and electrically coupled to the first sensor, the second sensor, and the computer. The trigger event may be a state of charge of the battery decreasing below a charge threshold.

The housing may be a center high-mounted stop lamp (CHMSL) housing, the first sensor may be arranged in the CHMSL housing so that a field of view of the first sensor encompasses a storage area of the vehicle when the CHMSL housing is installed, and the second sensor may be arranged in the CHMSL housing so that a field of view of the second sensor encompasses the storage area when the CHMSL housing is installed.

The first sensor may be a radar, and the second sensor may be a camera.

With reference to the Figures, a computer 118, 130 in a vehicle 100 includes a processor and a memory storing instructions executable by the processor to instruct a first sensor 102 to run at a scanning rate; in response to a trigger event, reduce the scanning rate; in response to receiving data from the first sensor 102 indicating a newly present object, turn on a second sensor 104; and then record data from the second sensor 104. The second sensor 104 has a higher power draw than the first sensor 102. The computer 118, 130 can be one computer or multiple computers wired together, e.g., a CHMSL control module 118, a vehicle computer 130, or both wired together. For the purposes of this disclosure, a "trigger event" is defined as a specific condition that can be true or false at a given time.

A system 106 including the computer 118, 130, the first sensor 102, the second sensor 104, etc. provides an energy-efficient way to monitor an area in, on, or around the vehicle 100. The second sensor 104, which is the more energy-intensive of the sensors 102, 104, can remain powered off until an event occurs for the second sensor 104 to record, as determined by the first sensor 102, which is the less energy-intensive of the sensors 102, 104. Furthermore, the first sensor 102 can have its scanning rate adjusted to run less frequently in situations in which more frequent scanning is less important, further saving energy. The energy savings are especially important for when the vehicle 100 is powered off and the first sensor 102 and second sensor 104 are relying on a finite supply of stored energy.

Figure 1:
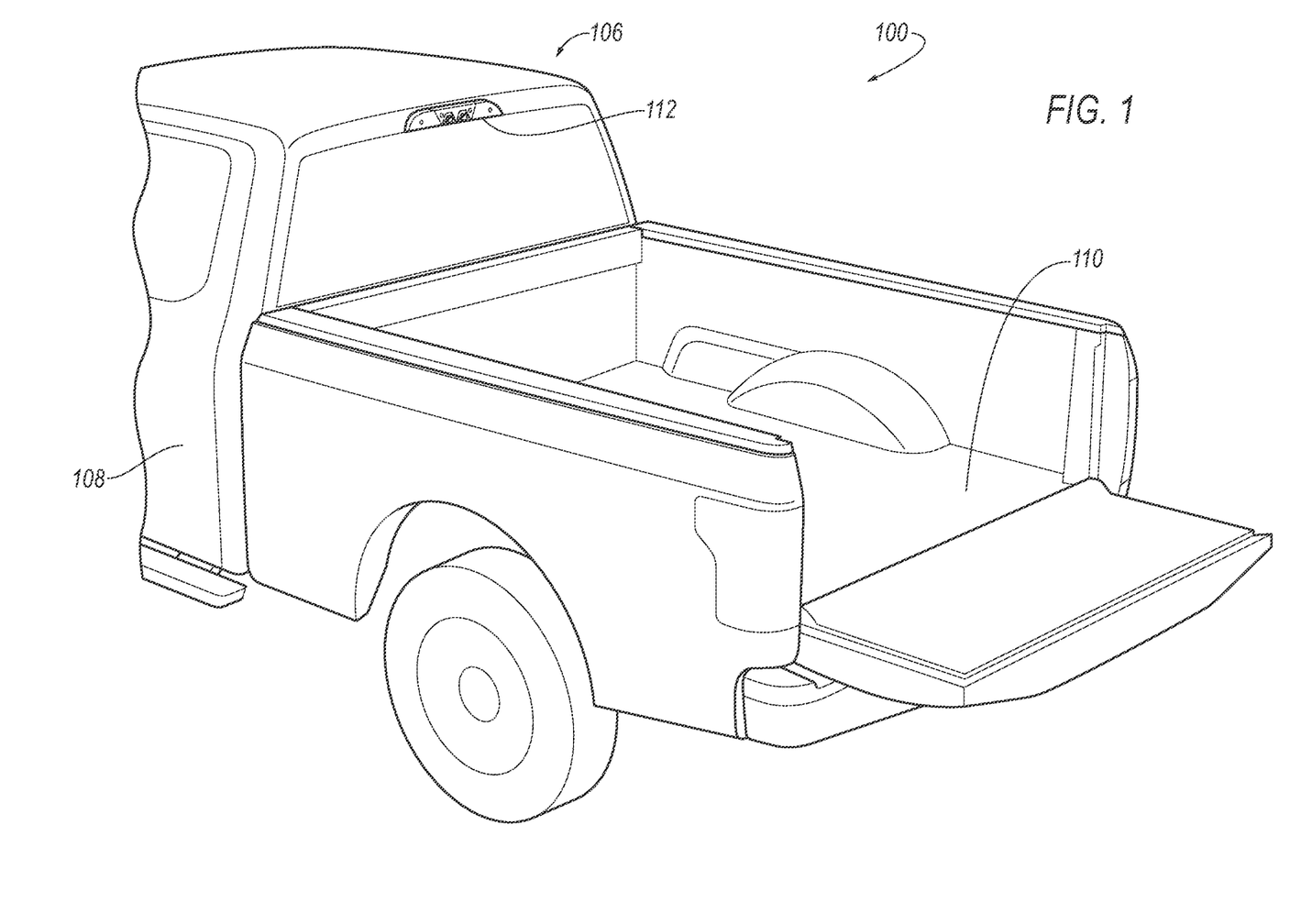
FIG. 1 is a rear perspective view of an example vehicle.

With reference to FIG. 1, the vehicle 100 may be any suitable type of automobile, e.g., a passenger or commercial automobile such as a sedan, a coupe, a truck, a sport utility, a crossover, a van, a minivan, a taxi, a bus, etc.

The vehicle 100 may include a body 108. The vehicle 100 may be of a unibody construction, in which a frame and the body 108 of the vehicle 100 are a single component. The vehicle 100 may, alternatively, be of a body-on-frame construction, in which the frame supports the body 108 that is a separate component from the frame. The frame and body 108 may be formed of any suitable material, for example, steel, aluminum, etc.

The body 108 of the vehicle 100 includes a storage area 110, i.e., an area to place cargo to be transported by the vehicle 100. The storage area 110 can be exposed, such as a pickup-truck bed, as shown in FIG. 1. The storage area 110 can instead include a covering, such as a trunk with a trunk lid.

Figure 2:
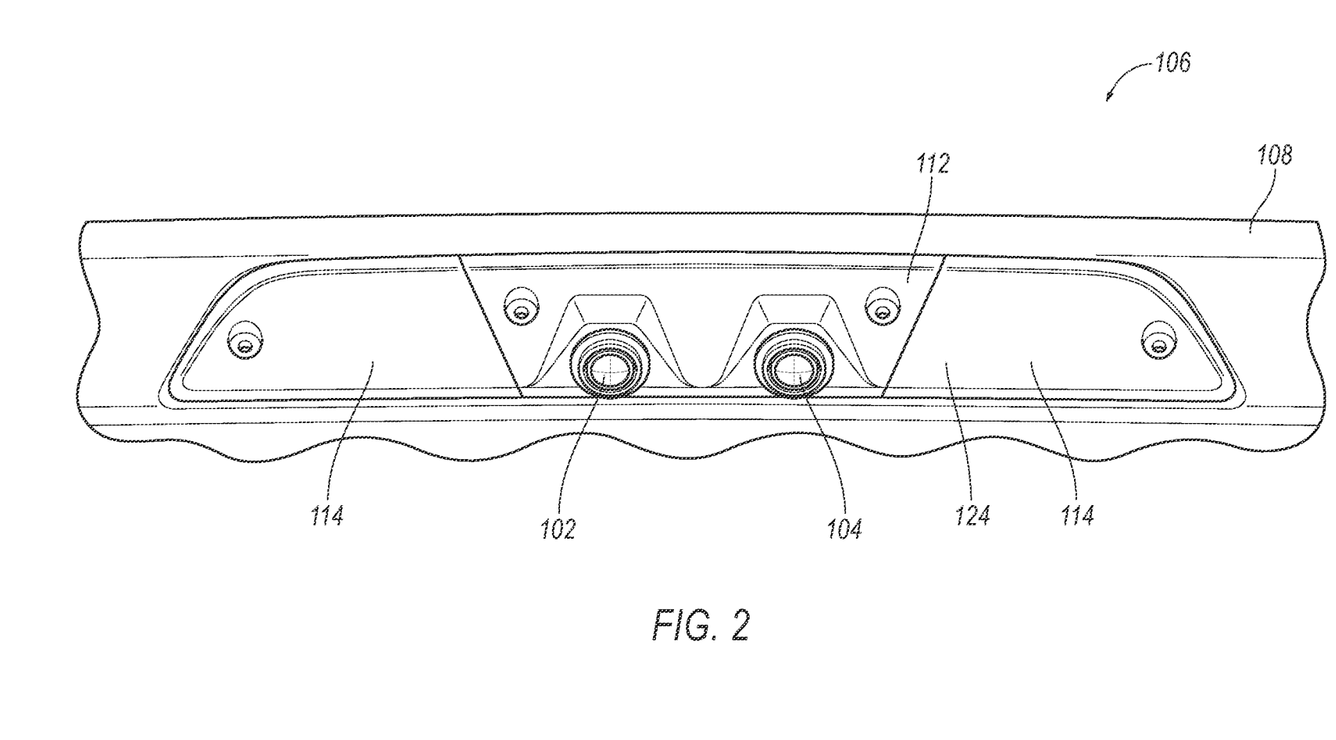
FIG. 2 is a plan view of a center high-mounted stop lamp (CHMSL) unit of the vehicle.
Figure 3:
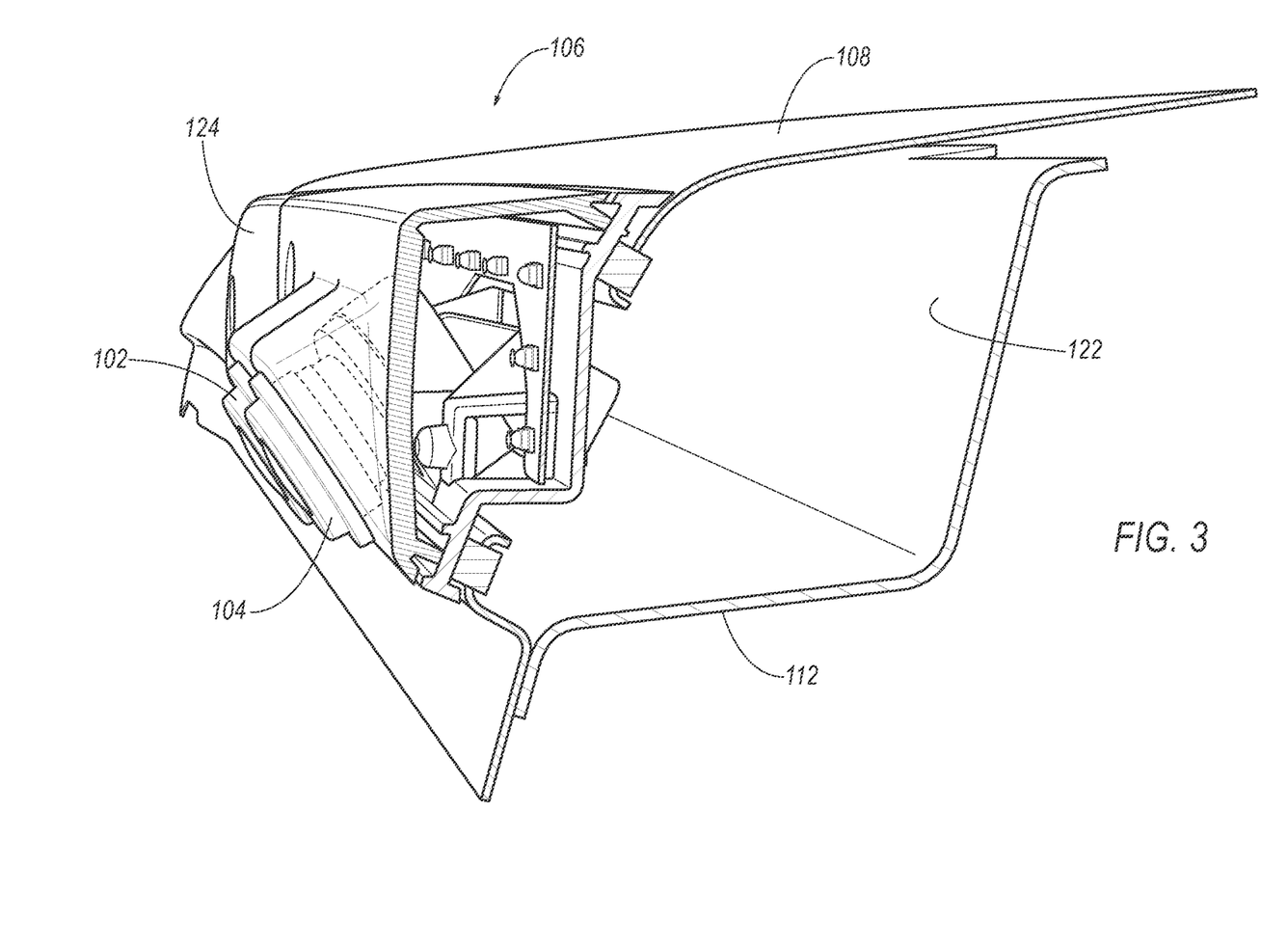
FIG. 3 is a perspective cutaway view of the CHMSL unit.
Figure 4:
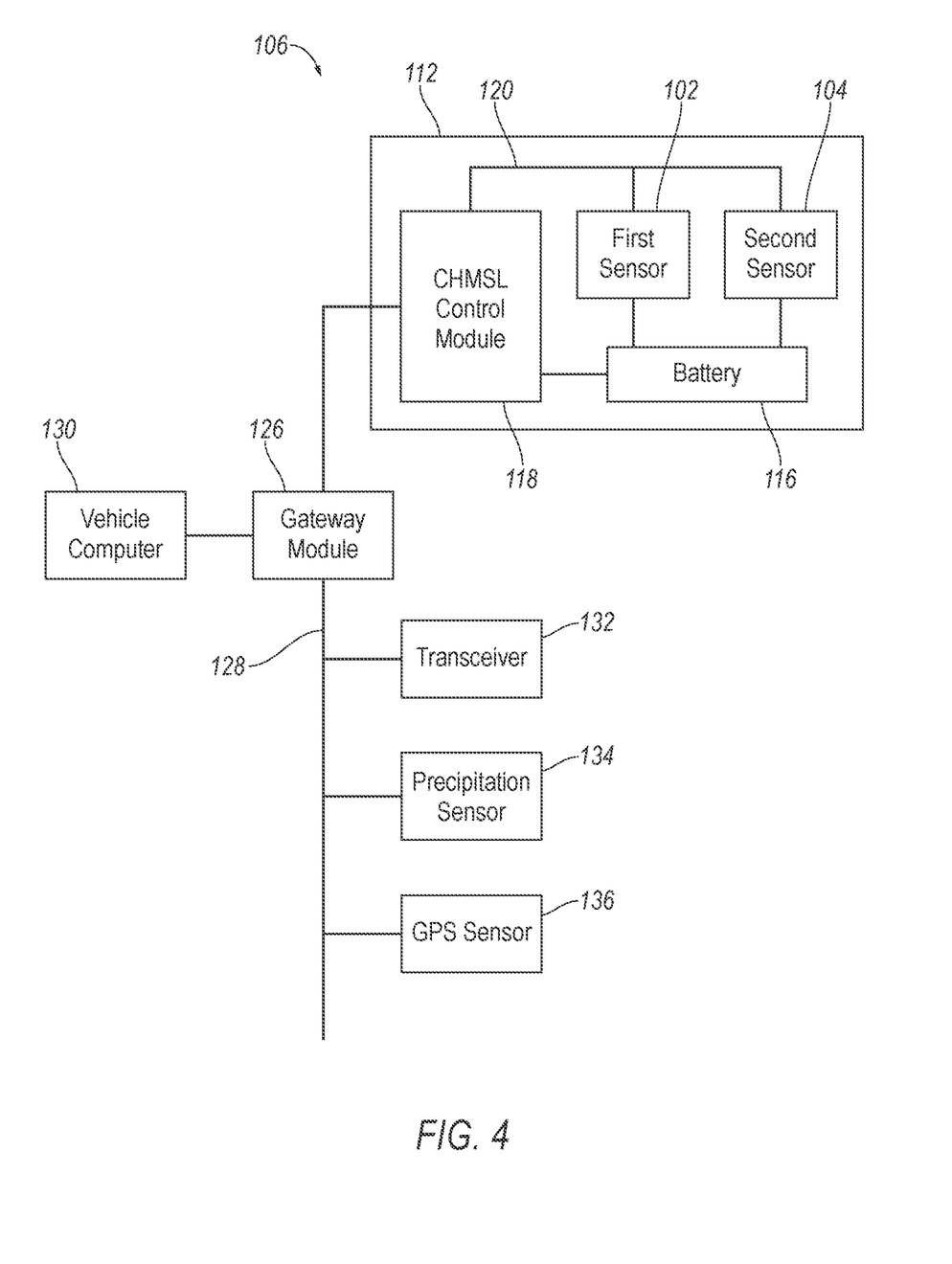
FIG. 4 is a block diagram of the CHMSL unit in the vehicle.

With reference to FIGS. 2 and 3, the vehicle 100 includes a center high-mounted stop lamp (CHMSL) housing 112. The CHMSL housing 112 contains the first sensor 102, the second sensor 104, at least one lamp 114, a battery 116, a CHMSL control module 118, and a local interconnect network (LIN) 120, as shown in FIG. 4. The CHMSL housing 112 can include an internal panel 122 and a lamp panel 124. The internal panel 122 can be concealed inside the body 108 of the vehicle 100. The lamp panel 124 can be exposed on the body 108 of the vehicle 100. Some or all of the lamp panel 124 is transparent, and some or all of the transparent portion of the lamp panel 124 is colored, e.g., red to indicate braking. The lamp panel 124 covers the lamps 114, which can be illuminated to indicate the vehicle 100 is braking and/or shifted into reverse.

The lamps 114 are positioned inside the CHMSL housing 112. The lamps 114 may be any lighting system suitable for easy visibility by other vehicles operating near the vehicle 100, e.g., tungsten, halogen, high-intensity discharge (HID) such as xenon, light-emitting diode (LED), laser, etc.

The first sensor 102 is a type suitable for detecting objects, e.g., in or near the storage area 110. In particular, the first sensor 102 can be a radar. A radar as is known uses radio waves to determine the relative location, angle, and/or velocity of an object by tracking the time required for the radio waves generated by the radar to reflect back to the radar. The first sensor 102 runs at a scanning rate, which is a frequency of generating and transmitting the radio waves, e.g., twice per second, four times per second, etc. The power draw, i.e., the rate of power consumption, of the first sensor 102 depends on the scanning rate, i.e., typically is higher for higher scanning rates.

The first sensor 102 can be arranged in the CHMSL housing 112 so that a field of view of the first sensor 102 encompasses the storage area 110 of the vehicle 100 when the CHMSL housing 112 is installed. For example, the first sensor 102 can be bolted into a fixed position relative to the CHMSL housing 112. The first sensor 102 can face rearward and downward.

The second sensor 104 is a type suitable for providing detailed data about a surrounding area, e.g., the storage area 110 and objects in or near the storage area 110. In particular, the second sensor 104 can be a camera. A camera as is known detects electromagnetic radiation in some range of wavelengths. For example, the camera may detect visible light, infrared radiation, ultraviolet light, or some range of wavelengths including visible, infrared, and/or ultraviolet light. The power draw of the second sensor 104 is higher than the power draw of the first sensor 102, for any scanning rate of the first sensor 102.

The second sensor 104 can be arranged in the CHMSL housing 112 so that a field of view of the second sensor 104 encompasses the storage area 110 when the CHMSL housing 112 is installed. For example, the second sensor 104 can be bolted into a fixed position relative to the CHMSL housing 112. The second sensor 104 can face rearward and downward.

With reference to FIG. 4, the battery 116 is disposed in the CHMSL housing 112. The battery 116 is electrically coupled to the first sensor 102, the second sensor 104, and the CHMSL control module 118. The battery 116 can be any type suitable for powering the first sensor 102, the second sensor 104, and the CHMSL control module 118 while the vehicle 100 is off, e.g., a lithium-ion battery, a nickel-metal hydride battery, a lead-acid battery, an ultracapacitor, etc.

The CHMSL control module 118 is a microprocessor-based computing device, e.g., a generic computing device including a processor and a memory, an electronic controller or the like, a field-programmable gate array (FPGA), an application-specific integrated circuit (ASIC), etc. The CHMSL control module 118 can thus include a processor, a memory, etc. The memory of the CHMSL control module 118 can include media for storing instructions executable by the processor as well as for electronically storing data and/or databases, and/or the CHMSL control module 118 can include structures such as the foregoing by which programming is provided.

The LIN 120 communicatively couples the CHMSL control module 118 to the first sensor 102, the second sensor 104, the battery 116, and a gateway module 126. The LIN 120 is a network employing a serial network protocol, specifically the local interconnect network standard.

The vehicle 100 includes the gateway module 126. The gateway module 126 is a control module that connects and transmits data between buses of different domains in the vehicle 100, e.g., the LIN 120, a controller area network (CAN) bus 128, Ethernet, other LINs, OBD-II, etc.

The vehicle 100 includes the CAN bus 128. The CAN bus 128 communicatively couples the gateway module 126, a vehicle computer 130, a transceiver 132, a precipitation sensor 134, a global positioning system (GPS) sensor 136, and other components. The vehicle computer 130 is communicatively coupled to the first sensor 102 and the second sensor 104 via the CAN bus 128 and the LIN 120. The CAN bus 128 is a network using a vehicle bus CAN standard, which is a message-based protocol employing multiplexing.

The vehicle computer 130 is a microprocessor-based computing device, e.g., a generic computing device including a processor and a memory, an electronic controller or the like, a field-programmable gate array (FPGA), an application-specific integrated circuit (ASIC), etc. The vehicle computer 130 can thus include a processor, a memory, etc. The memory of the vehicle computer 130 can include media for storing instructions executable by the processor as well as for electronically storing data and/or databases, and/or the vehicle computer 130 can include structures such as the foregoing by which programming is provided. The vehicle computer 130 can be multiple computers, e.g., control modules, coupled together.

The transceiver 132 may be adapted to transmit signals wirelessly through any suitable wireless communication protocol, such as Bluetooth®, WiFi, IEEE 802.11a/b/g, other RF (radio frequency) communications, etc. The transceiver 132 may be adapted to communicate with a remote computing device, that is, a computing device distinct and physically spaced from the vehicle 100. The remote computing device may be located outside the vehicle 100. For example, the remote computing device may be associated with another vehicle (e.g., V2V communications), an infrastructure component (e.g., V2I communications via Dedicated Short-Range Communications (DSRC) or the like), an emergency responder, a mobile device associated with the owner of the vehicle 100, etc. The transceiver 132 may be one device or may include a separate transmitter and receiver.

The GPS sensor 136 receives data from GPS satellites. The Global Positioning System (GPS) is a global navigation satellite system. The satellites broadcast time and geolocation data. The GPS sensor 136 can determine a location of the vehicle 100, i.e., latitude and longitude, based on receiving the time and geolocation data from multiple satellites simultaneously.

The precipitation sensor 134 can be any sensor suitable to detect precipitation. For example, the precipitation sensor 134 may be a piezoelectric sensor coupled to the windshield to detect vibrations from, e.g., precipitation. Vibration data such as amplitude and frequency may be associated with, e.g., types of precipitation such as rain or hail. Alternatively, the precipitation sensor 134 may be positioned where water from rain will pool and configured to detect such water. For example, the precipitation sensor 134 may include two electrical leads that, when connected, close a circuit; when water is present between the leads, the conductivity of water changes to allow current to flow through the circuit where previously it would not have done so, or changes how much current is flowing by a known amount. For another example, the precipitation sensor 134 may include an LED bulb, a light sensor, and possibly a prism reflecting light from the LED bulb to the light sensor; the presence of water scatters some of the light, reducing the light received by the light sensor by a known amount.

Figure 5:
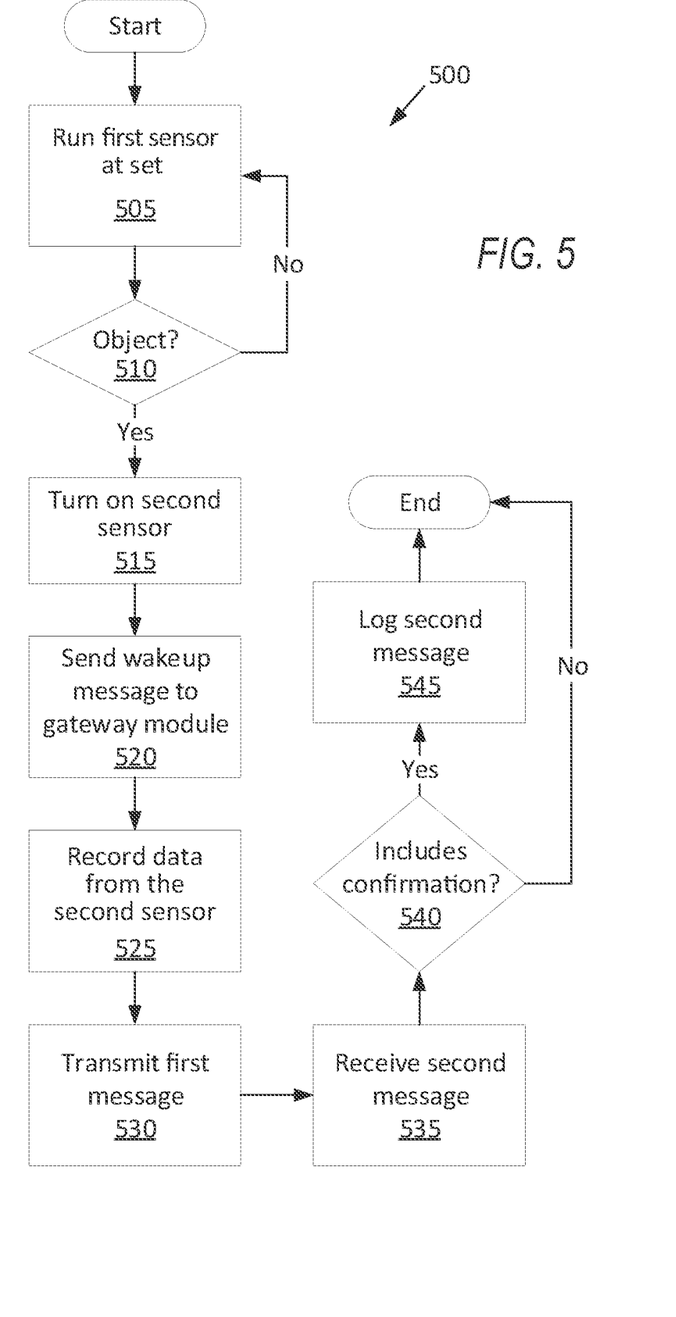
FIG. 5 is a process flow diagram of an example process for detecting an object in a storage area of the vehicle.

FIG. 5 is a process flow diagram illustrating an exemplary process 500 for detecting an object in the storage area 110. The memories of the CHMSL control module 118 and/or the vehicle computer 130 store executable instructions for performing the steps of the process 500 and/or programming can be implemented in structures such as mentioned above. The process 500 is run when the vehicle 100 is off. By default, when the vehicle 100 is off, i.e., when the process 500 begins, the vehicle computer 130 does not receive power and is off, the CHMSL control module 118 and the first sensor 102 draw power from the battery 116, and the second sensor 104 is off.

As a general overview of the process 500, the first sensor 102 is run at the scanning rate (which is set as described below in a process 600). Upon determining that the first sensor 102 detected an object, the CHMSL control module 118 turns on the second sensor 104 and sends a wakeup message the gateway module 126. Then the vehicle computer 130 records the data generated by the second sensor 104, transmits a first message to a remote computing device, and receives a second message from the remote computing device. The first message can include data from the second sensor 104. If the second message includes a confirmation (which can be selected by an operator at the remote computing device based on a judgment of the importance of the data from the second sensor 104), the vehicle computer 130 logs the second message.

The process 500 begins in a block 505, in which the CHMSL control module 118 instructs the first sensor 102 to run at a currently selected scanning rate. The process 600 described below determines the scanning rate and runs simultaneously with the process 500. The CHMSL control module 118 receives data from the first sensor 102 as the data is produced at the scanning rate.

Next, in a decision block 510, the CHMSL control module 118 determines whether the data received from the first sensor 102 indicates a newly present object, e.g., in the storage area 110 or a region including the storage area 110 and an area behind the vehicle 100. For example, the CHMSL control module 118 can determine from the data received from the first sensor 102 that radio waves in some direction indicate a shorter distance than before. If the data does not indicate a newly present object, the process 500 returns to the block 505 to continue monitoring the data from the first sensor 102 for newly present objects. If the data indicates a newly present object, the process 500 proceeds to a block 515.

In the block 515, the CHMSL control module 118 turns on the second sensor 104, e.g., via an instruction transmitted through the LIN 120.

Next, in a block 520, the CHMSL control module 118 transmits a message instructing at least one vehicle system to wake up. For example, the CHMSL control module 118 transmits a message to the gateway module 126 to wake up the vehicle computer 130 and the transceiver 132, which the gateway module 126 transmits to the vehicle computer 130 and the transceiver 132.

Next, in a block 525, the vehicle computer 130 then records data from the second sensor 104.

Next, in a block 530, the vehicle computer 130 instructs the transceiver 132 to transmit a first message to the remote computing device. The first message includes the recorded data from the second sensor 104. The remote computing device can be, e.g., a mobile device belonging to an owner or operator of the vehicle 100. The owner or operator thus has an opportunity to review the data from the second sensor 104, e.g., video or image data of the storage area 110 immediately after the first sensor 102 detected the newly present object, to assess whether something important is occurring in the storage area 110, e.g., the newly present object is a person attempting to remove objects from the storage area 110. If the owner or operator decides that the newly present object is of no concern or was a false positive, they can choose to ignore or discard the first message. If the newly present object is of concern to the owner or operator, they can choose to initiate a responsive process on the remote computing device. In either event, the remote computing device transmits a second message back to the vehicle computer 130 via the transceiver 132. If the owner or operator deemed the newly present object important, then the second message includes a confirmation of a presence of the newly present object.

Next, in a block 535, the vehicle computer 130 receives the second message from the remote computing device in response to the first message.

Next, in a decision block 540, the vehicle computer 130 determines whether the second message includes the confirmation of the presence of the newly present object. If no confirmation is included with the second message, the process 500 ends. If the second message includes the confirmation, the process 500 proceeds to a block 545.

In the block 545, the vehicle computer 130 records the second message in a log, i.e., stores the second message or part of the second message in memory. A current location of the vehicle 100 as determined from the GPS sensor 136 is stored paired with the second message. After the block 545, the process 500 ends.

Figure 6:
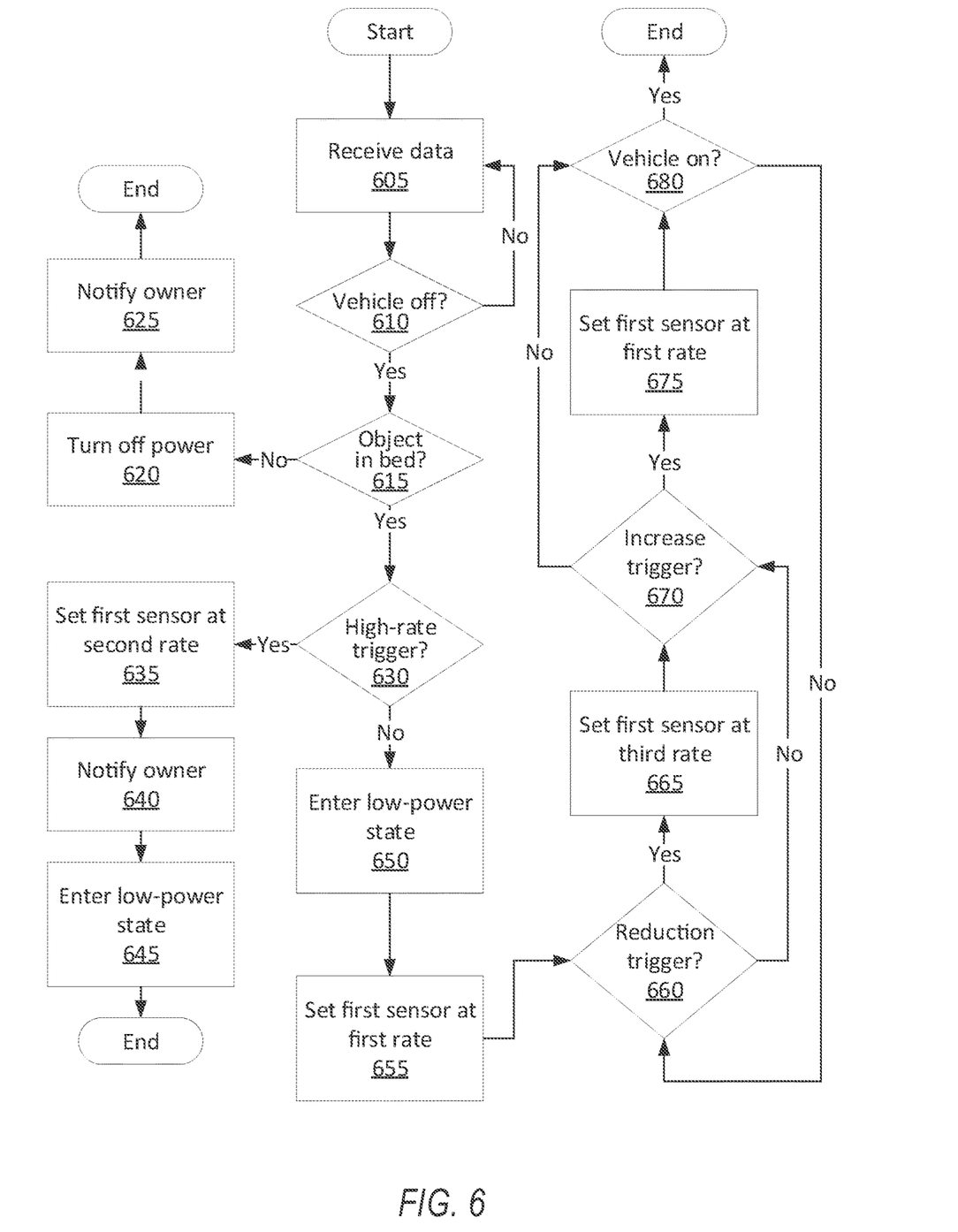
FIG. 6 is a process flow diagram of an example process for setting a scanning rate of a first sensor of the CHMSL unit.

FIG. 6 is a process flow diagram illustrating an exemplary process 600 for setting the scanning rate of the first sensor 102. The memories of the CHMSL control module 118 and/or the vehicle computer 130 store executable instructions for performing the steps of the process 600 and/or programming can be implemented in structures such as mentioned above. The process 600 begins while the vehicle 100 is on, i.e., running.

As a general overview of the process 600, when the vehicle 100 turns off, the vehicle computer 130 determines whether there are any objects in the storage area 110 and, if not, turns off the first sensor 102. If there is an object in the storage area 110, then the vehicle computer 130 determines whether a high-rate trigger event has occurred, e.g., precipitation or the vehicle 100 being in a location where a second message was logged. If a high-rate trigger event has occurred, the vehicle computer 130 sets the scanning rate of the first sensor 102 at a second scanning rate that is higher than a first scanning rate and then instructs the CHMSL control module 118 to enter a low-power state. The first scanning rate is the default rate of the first sensor 102. If no high-rate trigger event has occurred, the CHMSL control module 118 enters the low-power state and sets the scanning rate of the first sensor 102 at the first scanning rate. In the low-power state, the CHMSL control module 118 sets the scanning rate at a third scanning rate that is lower than the first scanning rate in response to a reduction trigger event, and sets the scanning rate back to the first scanning rate in response to an increase trigger event. The third scanning rate is chosen to conserve energy compared to the first scanning rate when the need for scanning is lower. Examples of reduction trigger events include failing to detect any newly present object for at least a threshold duration, a lack of any second messages recorded in the log from a current location of the vehicle 100, a state of charge of the battery 116 decreasing below a charge threshold, a time of day that is during daytime, and a distance to the previously present object being greater than a first distance threshold. Examples of increase trigger events include a time of day during nighttime and the distance to the previously present object being shorter than a second distance threshold. The process 600 ends when the vehicle 100 turns on.

The process 600 begins in a block 605, in which the vehicle computer 130 receives data from the GPS sensor 136, data from the precipitation sensor 134, data from the first sensor 102, and possibly data from the second sensor 104.

Next, in a decision block 610, the vehicle computer 130 determines whether the vehicle 100 has been turned off. The vehicle computer 130 can check a setting in memory that tracks the state of the vehicle 100. If the vehicle 100 is still on, the process 600 returns to the block 605 to continue monitoring data. If the vehicle 100 has just been turned off, the process 600 proceeds to a decision block 615.

In the decision block 615, the vehicle computer 130 determines whether the data from the first sensor 102 indicates a lack of previously present objects in a region, e.g., in the storage area 110, or in the storage area 110 and an area behind the vehicle 100 where a trailer could be present. The vehicle computer 130 may additionally use data from the second sensor 104 to determine whether objects are present in the region. For example, the vehicle computer 130 can compare the data from first sensor 102 and/or the second sensor 104 with baseline data stored in memory of the region when empty. If greater than a threshold amount of the data from the first sensor 102 and/or second sensor 104 deviates from the baseline data, then the vehicle computer 130 infers that an object is present in the region. If there are no objects in the region, the process 600 proceeds to a block 620. If an object is in the region, the process 600 proceeds to a decision block 630.

In the block 620, the vehicle computer 130 prevents the first sensor 102 from running, e.g., instructs the CHMSL control module 118 to turn off components on the LIN 120, i.e., the CHMSL control module 118, the first sensor 102, and the second sensor 104.

Next, in a block 625, the vehicle computer 130 transmits a message via the transceiver 132 to the remote computing device, e.g., to the mobile device of the owner or operator of the vehicle 100. The message can notify the owner or operator that the first sensor 102 is not running because the storage area 110 does not contain any objects. After the block 625, the process 600 ends.

In the decision block 630, the vehicle computer 130 determines whether a high-rate trigger event has occurred. A high-rate trigger event is an event chosen to indicate that the first sensor 102 should operate at the second scanning rate, i.e., the higher-than-default scanning rate. A first high-rate trigger event is whether the data from the precipitation sensor 134 indicates precipitation. A second high-rate trigger event is the data from the GPS sensor 136 indicating that the vehicle 100 is at a location where a second message was logged, i.e., where an owner or operator indicated the presence of a newly present object as described above with respect to the block 545 of the process 500. If a high-rate trigger event has occurred, the process 600 proceeds to a block 635. If no high-rate trigger event has occurred, the process 600 proceeds to a block 650.

In the block 635, the vehicle computer 130 instructs the CHMSL control module 118 to increase the scanning rate of the first sensor 102 to the second scanning rate. For example, the second scanning rate can be to 8 Hz, i.e., eight times per second.

Next, in a block 640, the vehicle computer 130 transmits a message via the transceiver 132 to the remote computing device, e.g., to the mobile device of the owner or operator of the vehicle 100. The message can notify the owner or operator that the first sensor 102 is running at the second scanning rate, i.e., at a higher-than-default scanning rate, and that the energy stored in the battery 116 may be consumed more quickly.

In the block 645, the vehicle computer 130 instructs the CHMSL control module 118 to put the LIN 120 in a low-power state. Specifically, the CHMSL control module 118 turns off the second sensor 104, and the CHMSL control module 118 can enter a mode in which the CHMSL control module 118 does not send messages to the gateway module 126 (except as described above with respect to the block 520 of the process 500). The vehicle computer 130 then turns off. After the block 645, the process 600 ends.

In the block 650, the vehicle computer 130 instructs the CHMSL control module 118 to put the LIN 120 in a low-power state. Specifically, the CHMSL control module 118 turns off the second sensor 104, and the CHMSL control module 118 can enter a mode in which the CHMSL control module 118 does not send messages to the gateway module 126 (except as described above with respect to the block 520 of the process 500). The vehicle computer 130 transmits the data received in the block 605 above to the CHMSL control module 118. The vehicle computer 130 also transmits the second messages recorded in the log, or the vehicle computer 130 transmits only the second messages recorded in the log at a current location of the vehicle 100, as defined by the data from the GPS sensor 136. The vehicle computer 130 transmits sunrise and sunset times for a next number of days, e.g., a number of days at which the battery 116 will expend energy equal to its capacity, e.g., five days. The vehicle computer 130 then turns off.

Next, in a block 655, the CHMSL control module 118 instructs the first sensor 102 to run at the first scanning rate, i.e., the default scanning rate. For example, the first scanning rate can be, e.g., 4 Hz, i.e., four times per second.

Next, in a decision block 660, the CHMSL control module 118 determines whether a reduction trigger event has occurred. A reduction trigger event is an event chosen to indicate that the first sensor 102 should operate at the third scanning rate, i.e., the lower-than-default scanning rate. If any of the reduction trigger events described immediately below are satisfied, the process 600 proceeds to a block 665. If none of the reduction trigger events are satisfied, the process 600 proceeds to a decision block 670.

A first reduction trigger event is failing to detect any newly present object for at least a threshold duration. In other words, the process 500 above runs for at least the threshold duration without moving beyond the decision block 510, i.e., just cycling between the block 505 and the decision block 510. The threshold duration can be chosen to, e.g., last for a busier time shortly after sundown in the evening and end during a less busy time at night, e.g., two hours.

A second reduction trigger event is a lack of any second messages recorded in the log from a current location of the vehicle 100. The CHMSL control module 118 may have received any second messages recorded in the log at the current location of the vehicle 100 in the block 650 above, and any second messages received by the CHMSL control module 118 indicate that the second reduction trigger event is satisfied. Alternatively, the CHMSL control module 118 may have received the second messages from the log and the GPS data, the CHMSL control module 118 determines whether any of the second messages are from the current location of the vehicle 100.

A third reduction trigger event is a state of charge of the battery 116 decreasing below a charge threshold. The CHMSL control module 118 can continuously receive the state of charge of the battery 116 via the LIN 120. The charge threshold can be chosen to indicate that the battery 116 is likely to run out of energy before the vehicle 100 is next turned on, e.g., within 24 hours.

A fourth reduction trigger event is a time of day that is during daytime. The CHMSL control module 118 can include a clock and can compare the current time to the sunrise and sunset times received from the vehicle computer 130 in the block 650. If the current time is after a sunrise time and before the next sunset time, then the fourth reduction trigger event is satisfied.

A fifth reduction trigger event is a distance to the previously present object being greater than a first distance threshold. The first distance threshold can be chosen to indicate that the previously present object is on a trailer or otherwise spaced from the vehicle 100, e.g., ten meters.

In the block 665, the CHMSL control module 118 reduces the scanning rate of the first sensor 102, e.g., instructs the first sensor 102 to run at the third scanning rate. For example, the third scanning rate can be, e.g., 2 Hz, i.e., two times per second.

Next, in the decision block 670, the CHMSL control module 118 determines whether an increase trigger event has occurred. An increase trigger event is an event chosen to indicate that the first sensor 102 should operate at the first scanning rate, i.e., the default scanning rate rather than the lower-than-default scanning rate. If any of the increase trigger events described immediately below are satisfied, the process 600 proceeds to a block 675. If none of the reduction trigger events are satisfied, the process 600 proceeds to a decision block 680.

A first increase trigger event is a time of day during nighttime. The CHMSL control module 118 can compare the current time to the sunrise and sunset times received from the vehicle computer 130 in the block 650. If the current time is after a sunset time and before the next sunrise time, then the first increase trigger event is satisfied.

A second increase trigger event is the distance to the previously present object being shorter than a second distance threshold. The second distance threshold can be chosen to indicate that the previously present object is, e.g., in the storage area 110, e.g., two meters.

In the block 675, the CHMSL control module 118 increases the scanning rate of the first sensor 102, e.g., instructs the first sensor 102 to run at the first scanning rate.

Next, in the decision block 680, the CHMSL control module 118 determines whether the vehicle 100 has turned on. The CHMSL control module 118 can determine that the vehicle 100 is on based on whether the CHMSL control module 118 has received a message from the gateway module 126 indicating that the vehicle 100 is on. If the vehicle 100 is still off, the process 600 returns to the decision block 660 to continue determining whether to adjust the scanning rate of the first sensor 102. If the vehicle 100 has turned on, the process 600 ends.

Computer executable instructions may be compiled or interpreted from computer programs created using a variety of programming languages and/or technologies, including, without limitation, and either alone or in combination, Java™, C, C++, Visual Basic, Java Script, Perl, HTML, etc. In general, a processor (e.g., a microprocessor) receives instructions, e.g., from a memory, a computer readable medium, etc., and executes these instructions, thereby performing one or more processes, including one or more of the processes described herein. Such instructions and other data may be stored and transmitted using a variety of computer readable media. A file in a networked device is generally a collection of data stored on a computer readable medium, such as a storage medium, a random access memory, etc. A computer readable medium includes any medium that participates in providing data (e.g., instructions), which may be read by a computer. Such a medium may take many forms, including, but not limited to, non volatile media, volatile media, etc. Non volatile media include, for example, optical or magnetic disks and other persistent memory. Volatile media include dynamic random access memory (DRAM), which typically constitutes a main memory. Common forms of computer readable media include, for example, a floppy disk, a flexible disk, hard disk, magnetic tape, any other magnetic medium, a CD ROM, DVD, any other optical medium, punch cards, paper tape, any other physical medium with patterns of holes, a RAM, a PROM, an EPROM, a FLASH EEPROM, any other memory chip or cartridge, or any other medium from which a computer can read.

The disclosure has been described in an illustrative manner, and it is to be understood that the terminology which has been used is intended to be in the nature of words of description rather than of limitation. Many modifications and variations of the present disclosure are possible in light of the above teachings, and the disclosure may be practiced otherwise than as specifically described.

The invention claimed is:

1. A computer comprising a processor and a memory storing instructions executable by the processor to:

instruct a first sensor to run at a scanning rate;
in response to a trigger event, reduce the scanning rate, wherein the trigger event includes a lack of messages stored in a log while a vehicle including the first sensor was previously at a current location of the vehicle;
in response to receiving data from the first sensor indicating a newly present object, turn on a second sensor, wherein the second sensor has a higher power draw than the first sensor; and
then record data from the second sensor.

2. The computer of claim 1, wherein the trigger event is failing to detect the newly present object for at least a threshold duration.

3. The computer of claim 1, wherein the messages are second messages, the instructions further include to transmit a first message including the recorded data from the second sensor to a remote computing device.

4. The computer of claim 3, wherein the instructions further include to receive the second message from the remote computing device in response to the first message, and to record the second message in the log upon determining that the second message includes a confirmation of a presence of the newly present object.

5. The computer of claim 4, wherein the instructions further include to, in response to the log including at least one second message stored while the vehicle was previously at the current location of the vehicle, increase the scanning rate.

6. The computer of claim 1, wherein the trigger event is a state of charge of a battery decreasing below a charge threshold.

7. The computer of claim 1, wherein the trigger event is a time of day being during daytime.

8. The computer of claim 1, wherein the trigger event is a first trigger event, and the instructions further include to, in response to a second trigger event, increase the scanning rate.

9. The computer of claim 8, wherein the second trigger event is data indicating precipitation.

10. The computer of claim 8, wherein the messages are second messages, the instructions include to transmit a first message to a remote computing device in response to the second trigger event.

11. The computer of claim 1, wherein the instructions include to prevent the first sensor from running in response to receiving data from the first sensor indicating a lack of previously present objects in a region.

12. The computer of claim 11, wherein the messages are second messages, the instructions include to transmit a first message to a remote computing device in response to receiving the data from the first sensor indicating a lack of previously present objects in the region.

13. The computer of claim 1, wherein the messages are second messages, the instructions include to, in response to receiving the data from the first sensor indicating the newly present object, transmit a first message instructing at least one vehicle system to wake up.

14. A system for a vehicle comprising:
a first sensor;
a second sensor having a higher power draw than the first sensor; and
a computer communicatively coupled to the first sensor and the second sensor;
wherein the computer is programmed to:
instruct the first sensor to run at a scanning rate;
in response to a trigger event, reduce the scanning rate, wherein the trigger event includes a lack of messages stored in a log while the vehicle was previously at a current location of the vehicle;
in response to receiving data from the first sensor indicating a newly present object, turn on the second sensor; and
then record data from the second sensor.

15. The system of claim 14, further comprising a housing containing the first sensor, the second sensor, and the computer.

16. The system of claim 15, further comprising a battery in the housing and electrically coupled to the first sensor, the second sensor, and the computer.

17. The system of claim 16, wherein the trigger event is a state of charge of the battery decreasing below a charge threshold.

18. The system of claim 15, wherein the housing is a center high-mounted stop lamp (CHMSL) housing, the first sensor is arranged in the CHMSL housing so that a field of view of the first sensor encompasses a storage area of the vehicle when the CHMSL housing is installed, and the second sensor is arranged in the CHMSL housing so that a field of view of the second sensor encompasses the storage area when the CHMSL housing is installed.

19. The system of claim 14, wherein the first sensor is a radar, and the second sensor is a camera.

* * * * *